(12) United States Patent
Ben Artsi (10) Patent No.: US 8,502,342 B1
(45) Date of Patent: Aug. 6, 2013

(54) CIRCUITS, SYSTEMS, AND METHODS FOR REDUCING EFFECTS OF CROSS TALK IN I/O LINES AND WIRE BONDS

(71) Applicant: Marvell Israel (M.I.S.L.) Ltd., Yokneam Ilit (IL)

(72) Inventor: Liav Ben Artsi, Qiriyat Yam (IL)

(73) Assignee: Marvell Israel (M.I.S.L.) Ltd., Yokneam Ilit (IL)

( * ) Notice: Subject to any disclaimer, the term of this patent is extended or adjusted under 35 U.S.C. 154(b) by 0 days.

(21) Appl. No.: 13/684,331

(22) Filed: Nov. 23, 2012

Related U.S. Application Data (63) Continuation of application No. 11/125,490, filed on May 9, 2005, now Pat. No. 8,319,313.

(60) Provisional application No. 60/622,194, filed on Oct. 26, 2004.

(51) Int. Cl.
 *H01L 29/00* (2006.01)

(52) U.S. Cl.
 USPC .................. 257/532; 257/758; 257/E23.144

(58) Field of Classification Search
 USPC ............. 257/532, 535, 758, 773, E23.142, 257/E23.144; 438/129, 598, 599
 See application file for complete search history.

(56) References Cited

U.S. PATENT DOCUMENTS

| | | |
|---|---|---|
| 5,828,106 A | 10/1998 | Sato |
| 5,914,526 A | 6/1999 | Iwata |
| 6,061,222 A | 5/2000 | Morris et al. |
| 6,355,970 B1 | 3/2002 | Fujii |
| 6,387,775 B1 | 5/2002 | Jang et al. |
| 6,404,780 B1 | 6/2002 | Laturell et al. |
| 6,410,381 B2 | 6/2002 | Kim et al. |
| 6,559,493 B2 | 5/2003 | Lee et al. |
| 6,625,006 B1 | 9/2003 | Aram et al. |
| 6,713,836 B2 | 3/2004 | Liu et al. |
| 6,743,658 B2 | 6/2004 | Corisis |
| 6,757,967 B2 | 7/2004 | Jimarez et al. |
| 6,769,923 B2 | 8/2004 | Caldwell |
| 6,778,398 B2 | 8/2004 | Wyland |
| 6,781,242 B1 | 8/2004 | Fan et al. |
| 6,784,050 B1 | 8/2004 | Sutardja et al. |
| 6,790,710 B2 | 9/2004 | Fan et al. |
| 6,791,429 B2 | 9/2004 | Mikalauskas |
| 6,794,702 B2 | 9/2004 | Park |
| 6,803,252 B2 | 10/2004 | Lao et al. |
| 6,818,472 B1 | 11/2004 | Fan et al. |
| 6,825,572 B2 | 11/2004 | Tian et al. |
| 6,831,479 B2 | 12/2004 | Lo |
| 6,911,739 B1 | 6/2005 | Jin et al. |
| 6,977,444 B1 | 12/2005 | Jin et al. |
| 6,987,326 B1 | 1/2006 | Jin et al. |
| 7,009,308 B1 | 3/2006 | Jin et al. |
| 2003/0042044 A1 | 3/2003 | Kirk |

*Primary Examiner* — Matthew E Warren (57) ABSTRACT

Circuits, architectures, a system and methods for reducing the effect(s) of cross talk in neighboring I/O signal paths. The circuitry includes input/output (I/O) pads having I/O signal lines coupled thereto, and a capacitor having terminals coupled to the I/O pads and/or signal lines. The method includes transmitting or receiving a signal along a first I/O signal line in an integrated circuit, the first I/O signal line communicating with a first I/O pad on the integrated circuit, and the integrated circuit having a second I/O signal line communicating with a second I/O pad; and capacitively coupling the first signal to the second I/O pad and/or the second I/O signal line, to reduce the effect(s) of cross talk in the second I/O signal line. The present invention can significantly reduce the effects of cross talk in neighboring I/O signal paths, for both input and output signals.

20 Claims, 6 Drawing Sheets

(12) United States Patent

CIRCUITS, SYSTEMS, AND METHODS FOR REDUCING EFFECTS OF CROSS TALK IN I/O LINES AND WIRE BONDS

CROSS-REFERENCE TO RELATED APPLICATIONS

This application is a Continuation of U.S. application Ser. No. 11/125,490, filed May 9, 2005, which claims the benefit of U.S. Provisional Application No. 60/622,194, filed Oct. 26, 2004, the disclosures of each of which are incorporated herein by reference in their entireties.

FIELD OF THE INVENTION

The present invention generally relates to the field of integrated circuit packaging. More specifically, embodiments of the present invention pertain to circuits, architectures, systems, and methods for reducing the effect(s) of cross talk in wire bonds and other input/output (I/O) signal lines.

DISCUSSION OF THE BACKGROUND

Many integrated circuit (IC) packages use gold wires ("wire bonds") to transfer electrical signals between an IC die and the leadframe or other packaging substrate on which the die is mounted. With increasing miniaturization of integrated circuits and the corresponding packaging, wire bonds are generally placed closer and closer to each other. When adjacent wire bonds are sufficiently close, transmission of an electrical signal on one wire may cause cross-talk in a neighboring wire, due to a parasitic inductance between the neighboring wire bonds (to which a substrate, or signal paths/traces thereon, may contribute).

Figure 1:
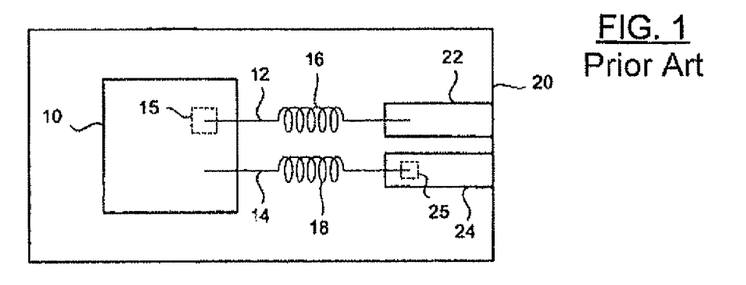
FIG. 1 is a diagram showing an arrangement of adjacent wire bonds in a conventional IC package containing a die and a packaging substrate.

FIG. 1 shows an IC die 10 and packaging substrate 20, having wire bonds 12 and 14 therebetween. The parasitic inductance between wire bonds 12 and 14 is shown by the coupled inductor symbol 16 and 18, taken together. A signal transmitted on one of the wire bonds 12 or 14 will induce a small, complementary signal in the other, neighboring wire bond. This small, complementary signal may manifest itself in the form of noise or jitter in the neighboring wire bond.

Figure 2:
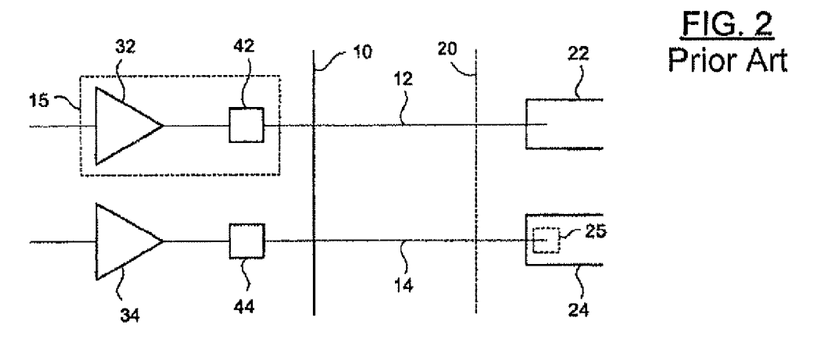
FIG. 2 is a diagram showing conventional circuitry associated with the wire bonds in the conventional arrangement of FIG. 1.
Figure 3:
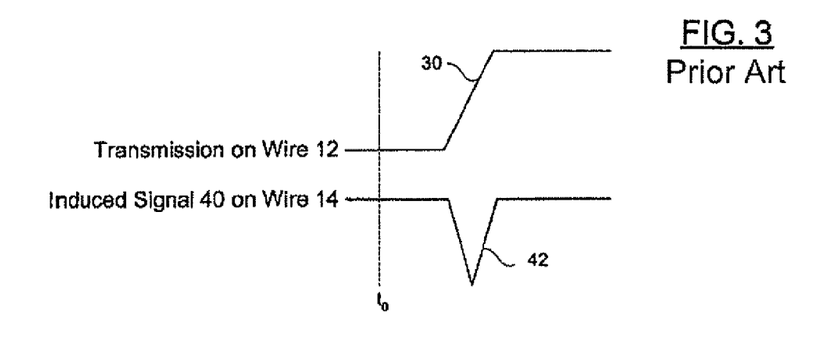
FIG. 3 is a set of waveforms showing the effect(s) of cross talk induced by an adjacent wire bond in the conventional arrangement of FIG. 1.

FIG. 2 shows exemplary terminals on die 10 and substrate 20 for wire bonds 12 and 14. As shown, both wire bonds 12 and 14 are output paths (i.e., they carry output signals from die 10 to substrate 20). A signal originating on die 10 may be output by buffer 32 (in output or I/O block 15) to bond pad 42. Wire bond 12 transfers the signal from bond pad 42 to lead 22 on packaging substrate 20. As shown in FIG. 3, a signal toggling on wire bond 12 (e.g., having a rising or positive transition 30) induces noise having a negative polarity (e.g., in this case, a short falling or negative edge 42 in the waveform 40) on wire bond 14 (e.g., as detected in or around bond area 25). After the transition 30 on wire bond 12 is substantially complete, the negative edge 42 ends, and the level of signal 40 on wire bond 14 returns to its level at $t_0$, prior to transition 30 on wire bond 12. Under some conditions, the induced signal 40 may exhibit a "ringing" characteristic. Such induced signals generally manifest themselves as noise or jitter on neighboring I/O wire bonds.

As operational speeds of I/O signals increase, the need exists to minimize any adverse effects of such induced crosstalk between neighboring I/O signal paths.

SUMMARY OF THE INVENTION

Embodiments of the present invention relate to circuitry, architectures, systems, and methods for reducing cross talk in adjacent I/O lines in an integrated circuit. The circuitry generally comprises (a) a first input/output (I/O) pad having a first I/O signal line coupled thereto; (b) a second I/O pad having a second I/O signal line coupled thereto; and (c) a first capacitor having (i) a first terminal coupled to the first I/O pad and/or the first I/O signal line, (ii) a second terminal coupled to the second I/O pad and/or the second I/O signal line, and (iii) a capacitance sufficient to reduce effects of cross talk between the first and second I/O signal lines. The architectures and/or systems generally comprise those that include a circuit embodying one or more of the inventive concepts disclosed herein.

The method generally comprises the steps of (1) transmitting or receiving a signal along a first I/O signal line in an integrated circuit, the first I/O signal line communicating with a first I/O pad on the integrated circuit, and the integrated circuit having a second I/O signal line communicating with a second I/O pad; and (2) capacitively coupling the signal to the second I/O pad and/or the second I/O signal line, sufficiently to reduce the effect(s) of cross talk in the second I/O signal line.

The present invention advantageously reduces or substantially eliminates the effect(s) of cross talk among adjacent or neighboring I/O signal lines, thereby reducing or eliminating potential sources of noise and jitter. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, signals or waveforms within a computer, circuit board, processor, controller and/or memory. These descriptions and representations are generally used by those skilled in the data processing and/or integrated circuit arts to effectively convey the substance of their work to others skilled in the art. A process, procedure, logic block, function, operation, etc., is herein, and is generally, considered to be a self-consistent sequence of steps or instructions leading to a desired and/or expected result. The steps relating to signal transmissions generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, teems, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, may refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the term "input/output," or "I/O," refers to input and/or output, not necessarily both input and output. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns circuitry, architectures, systems, and methods for reducing or substantially eliminating the effect(s) of cross talk in neighboring I/O lines in integrated circuitry. The integrated circuitry generally comprises (a) a first input/output (I/O) pad having a first I/O signal line coupled thereto; (b) a second I/O pad having a second I/O signal line coupled thereto; and (c) a first capacitor having (i) a first terminal coupled to the first I/O pad and/or the first I/O signal line, (ii) a second terminal coupled to the second I/O pad and/or the second I/O signal line, and (iii) a capacitance sufficient to reduce effects of cross talk between the first and second I/O signal lines. Signals on the I/O signal lines generally induce cross talk in each other, and the capacitor is generally configured to reduce or substantially eliminate the effect(s) of the cross talk. The architectures and/or systems generally comprise those that include hardware embodying one or more of the inventive concepts disclosed herein.

A further aspect of the invention concerns a method of reducing or substantially eliminating the effect(s) of cross talk that may be present in an integrated circuit. The method generally comprises the steps of (1) transmitting or receiving a signal along a first I/O signal line in an integrated circuit, the first I/O signal line communicating with a first I/O pad on the integrated circuit, and the integrated circuit having a second I/O signal line communicating with a second I/O pad; and (2) capacitively coupling the signal to the second I/O pad and/or the second I/O signal line, sufficiently to reduce the effect(s) of cross talk in the second I/O signal line.

The invention, in its various aspects, will be explained in greater detail below with regard to exemplary embodiments.

An Exemplary Integrated Circuit and/or Architecture

In one aspect, the present invention relates to an integrated circuit, comprising (a) a first input/output (I/O) pad having a first I/O signal line coupled thereto; (b) a second I/O pad having a second I/O signal line coupled thereto; and (c) a first capacitor having (i) a first terminal coupled to the first I/O pad and/or the first I/O signal line, (ii) a second terminal coupled to the second I/O pad and/or the second I/O signal line, and (iii) a capacitance sufficient to reduce effects of cross talk between the first and second I/O signal lines. Thus, the present invention may also relate to an integrated circuit, comprising (a) a means for transmitting or receiving a first input/output (I/O) signal; (b) a means for transmitting or receiving a second I/O signal; and (c) a first means for reducing effect(s) of cross talk between the first and second I/O signal transmitting or receiving means.

In one embodiment, the I/O signal lines in the present integrated circuit comprise wire bonds (e.g., gold wire conventionally stitch- or ball-bonded at one end to a bond pad on an IC die and at the other end to a conductor in an integrated circuit package substrate). Such wire bonds are typically used with certain IC package types, such as dual in-line packages, small outline IC packages, and quad flat packs (where the package substrate comprises a lead frame) and ball grid arrays (where the package substrate comprises a conventional insulative BGA substrate, such as polyimide, a conventional prepreg material or other relatively stiff plastic-based film or sheet, having a plurality of conductive traces thereon for transmitting signals between the IC die and conductive vias through the BGA substrate to solder balls on the underside of the BGA substrate). The wire bonds may even transmit signals from one die to another die in a multi-die module or stacked die package (in which case the "packaging substrate" may comprise a second die). In such a case, neighboring or adjacent I/O signal paths may be attached at one end to neighboring or adjacent I/O bond pads, but at the other end to different substrates (e.g., a second die and a lead or trace). As long as the capacitor is coupled between the bond pads (or busses carrying the I/O signals between the bond pads and the on-chip input/output buffers, which may also be considered part of the I/O signal line) in such a case, the cross-talk reducing effects of the invention may be realized.

In alternative embodiments, the I/O signal lines may comprise traces on other types of IC packaging substrates, such as on so-called "flip chip" ball grid array substrates (in which case, each of the I/O signal lines may further comprise a solder ball electrically coupling a bond pad on the IC die to a flip chip BGA trace), leadless chip carriers, chip (or wafer) scale packages, memory cards and sticks, game and I/O cards, etc. Such substrates or package types may be a component in a system-level package, such as for a wireless communication device (where the package may contain a passive device such as an antenna or an inductor), a surface acoustic wave filter, a microelectromechanical (MEM) device, an optoelectrical device, a CMOS image sensor-based camera, etc., although the present invention enjoys its greatest advantage on wire bond packages that may have a significant cross inductance characteristic.

The IC may comprise a relatively large number of I/O signal paths. In the context of the invention, an I/O signal path is generally any physical conductive path from off-chip to on-chip (or vice versa), other than power supply (e.g., Vcc, ground or Vss), including paths or lines for data (e.g., for read and write transactions or operations), control information (such as enable signals, address signals, mode selection signals, strobe signals, reset signals, status signals or flags, etc.), clock or other periodic signals (such as reference frequencies), commands, test inputs, etc., although the present invention enjoys its greatest advantage on I/O signal paths that carry signals that may have a relatively high transition rate (e.g., data, address and clock signals). In a further embodiment, the I/O signal paths do not include configuration information (i.e., signals that identify and/or determine a configuration of the IC, having a value that, once established, generally does not change unless the IC or system is reprogrammed). The number of such I/O signal paths in an IC may be any number for any conventional IC package, from 2 to about 2000, but more typical minimum numbers of I/O signal paths in an IC may be at least 20, at least 40, or at least 50.

Typically, the cross talk comprises a modification to a signal on an I/O signal path, induced by a transition on an adjacent or neighboring I/O signal path. The cross talk generally manifests itself as noise (e.g., amplitude or voltage noise) and/or jitter (e.g., timing jitter), although under certain circumstances, cross talk could cause a "glitch" (e.g., an incorrect value for a data bit or symbol transmitted over the I/O signal path affected by the cross talk). At times, the wave form on the I/O signal path affected by the cross talk may exhibit a "ringing" characteristic (see, e.g., FIG. 11 and the discussion thereof below).

Generally, the capacitor has a capacitance sufficient to reduce, minimize or substantially cancel or eliminate the effect(s) of cross talk in the second I/O signal line. A capacitance value for the capacitor can be simulated and/or calculated such that it effectively cancels the known and/or empirically determined package cross-inductance value. For most modern semiconductor fabrication and packaging processes (e.g., smaller than or about equal to 0.25 µm process technology and a BGA package of about 1.0 mm ball pitch), a capacitance of from about 1 pF to about 3 pF (preferably, from about 2.0 pF to about 2.7 pF, and in certain implementations, from about 2.2 pF to about 2.5 pF) is sufficient to significantly reduce, minimize or substantially cancel the effect(s) of the cross talk in the second I/O signal line.

Figure 4:
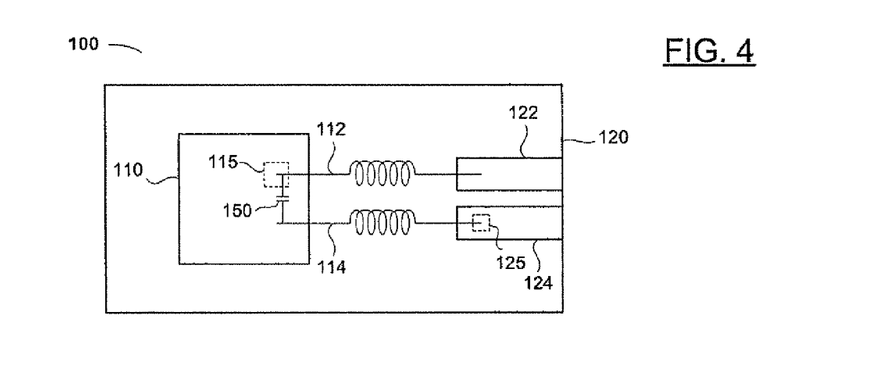
FIG. 4 is a diagram showing an embodiment of the present invention.

FIG. 4 shows a first exemplary embodiment 100, including die 110, package substrate 120, capacitor 150, and first and second I/O signal paths 112 and 114, respectively. Capacitor 150 has a first terminal coupled to first I/O signal path 112 in input/output region 115 of die 110, and a second terminal coupled to second I/O signal path 114 on die 110 (generally between bond pads; see, e.g., bond pads 142 and 144 in FIG. 5).

Figure 5:
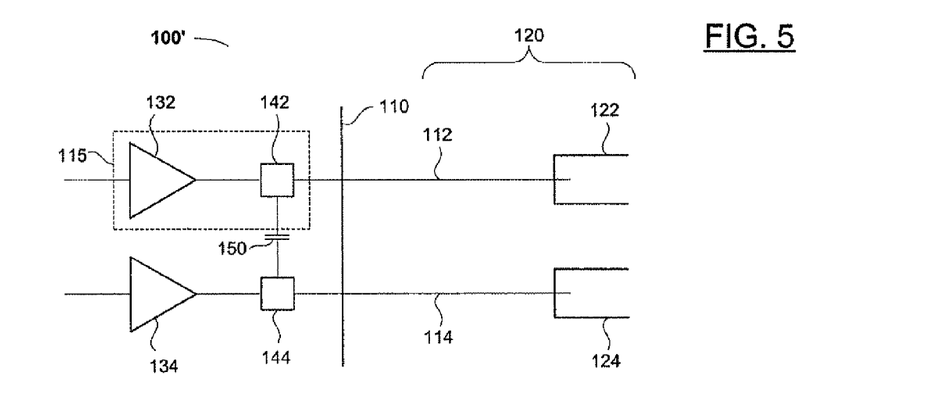
FIG. 5 is a diagram showing a more detailed implementation of the embodiment of FIG. 4.

FIG. 5 shows more detailed embodiment 100' corresponding to embodiment 100 of FIG. 4, where like numbers refer to like components. On die 110, region 115 contains an output buffer 132 and bond pad 142, to which one end of wire bond 112 is bonded. The corresponding end of wire bond 114 is bonded to bond pad 144, which receives an output signal from output buffer 134. Capacitor 150 is coupled between bond pads 142 and 144. Package substrate 120 comprises leads 122 and 124, respectively having the other ends of wire bonds 112 and 114 bonded thereto.

Figure 6:
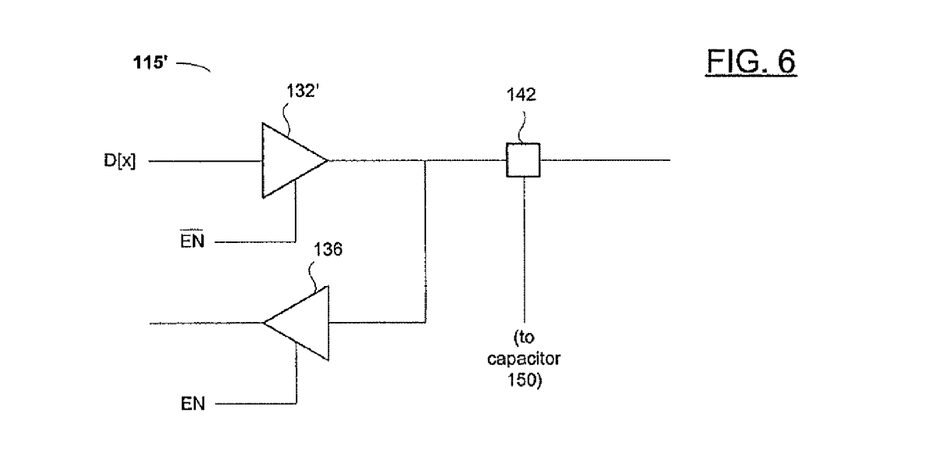
FIG. 6 is diagram showing a conventional I/O block on an integrated circuit.

Naturally, output region 115 can be configured as an input block, or as an I/O block 115' (see, e.g., FIG. 6). I/O block 115' differs from region 115 in FIG. 5 largely in that I/O block 115' (FIG. 6) further includes an input buffer 136 configured to receive input signals transmitted to bond pad 142 by an I/O signal path (not shown in FIG. 6), and output buffer 132' receives an enable, or three-state, signal (e.g., EN) configured to place output buffer 132' in a high-impedance state when I/O block 115' is configured to receive an input signal. It is well within the abilities of one skilled in the art to design and use input circuit blocks configured to receive input signals, output circuit blocks configured to transmit output signals, and I/O circuit blocks configured to receive input signals and transmit output signals. Thus, the invention may be implemented between any I/O pads, regardless of whether they are two inputs or two outputs. In most cases, however, one may not wish to connect or otherwise couple a capacitor between one output pad and an adjacent input pad. In fact, in some cases and/or under certain conditions, doing so may even do more harm than good with regard to reducing or minimizing induced jitter and/or noise.

Figure 7:
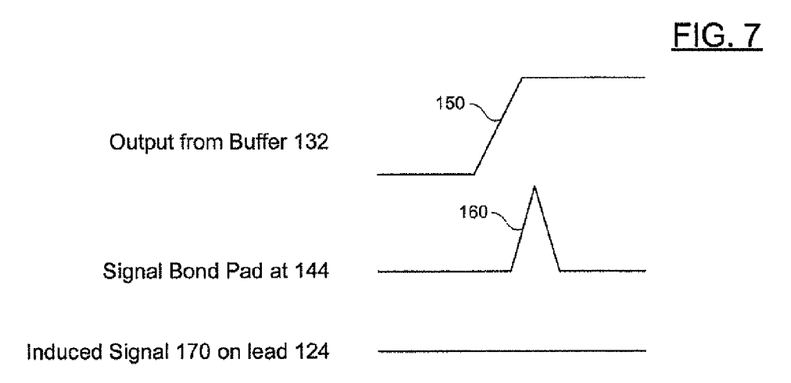
FIG. 7 is a set of waveforms showing the effect of cross talk substantially eliminated by the present invention.

Qualitatively, the results provided by the present invention can be better understood with reference to the waveforms shown in FIG. 7. As a result of the added capacitance in accordance with this invention, a signal from output buffer 132 (see FIG. 6) toggling on wire bond 112 (e.g., having a rising or positive transition 150 in FIG. 7) causes capacitively-coupled noise having a positive polarity (e.g., in this case, a short rising or positive edge 160) at bond pad 144 (see FIG. 6), to which second wire bond 114 is bonded. The negative-polarity noise that would have been induced in second wire bond 114 by transition 150 (FIG. 7) on first wire bond 112 (FIG. 6) as a result of the cross inductance between the two wire bonds is effectively canceled by the positive-polarity noise introduced onto the second I/O signal path by capacitor 150. Thus, as shown in the induced signal 170 (FIG. 7), lead 124 (FIG. 6) on the packaging substrate 120 transmits relatively or substantially less noise and/or jitter than an otherwise identical IC without capacitor 150. Because there may be some minor phase and/or amplitude differences between the substantially offsetting noise signals induced in the second I/O signal path, noise and/or jitter may not be completed eliminated in the second I/O signal path, and the induced signal 170 in FIG. 7 may appear as a small ripple, or S-shaped waveform.

Furthermore, in actual practice, there is cross inductance between wire bonds that are neighbors of second degree (i.e., having another wire bond in between; see, e.g., FIG. 12 and the corresponding discussion thereof below). This cross inductance may not be eliminated unless another capacitor is in communication with the corresponding pads (although this may sometimes complicate the implementation). Also, the amount of capacitance for effectively canceling jitter is usually different from the capacitance amount for effectively canceling voltage noise, which means that one may optimize the capacitor configuration and/or the capacitance for reducing or canceling either jitter or noise, depending on the application.

Figure 8:
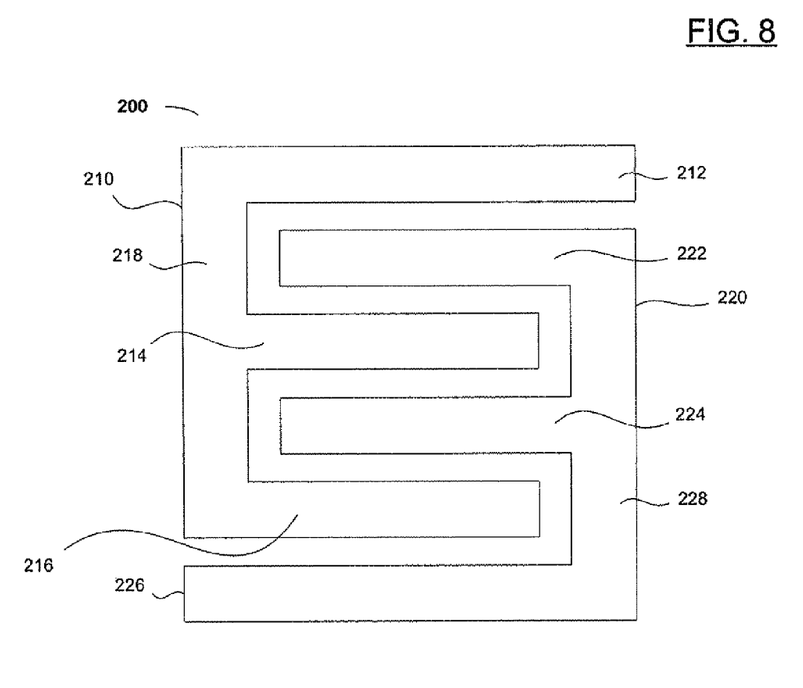
FIG. 8 shows one exemplary capacitor layout suitable for use in the present invention.

FIG. 8 shows a top-down (or layout) view of a first embodiment of a capacitor 200 suitable for use in the present invention. The capacitor 200 generally comprises first metal structure 210 and second structure 220 in a single layer of metal. Each of the first and second metal structures 210 and 220 may comprise a plurality of interleaved fingers (e.g., 212, 214, 216, 222, 224 and 226) each connected at one end to a perpendicular backbone (e.g., 218 and 228). Naturally, each capacitor plate may comprise any number of such fingers that can be fabricated according to the design and layout rules for a given manufacturing technology. Examples of such capacitors can be found in U.S. Pat. Nos. 6,794,702 and 6,625,006. Thus, in the present integrated circuit, the first and second I/O pads and the first capacitor may be on a single die (i.e., the same die).

Figure 9:
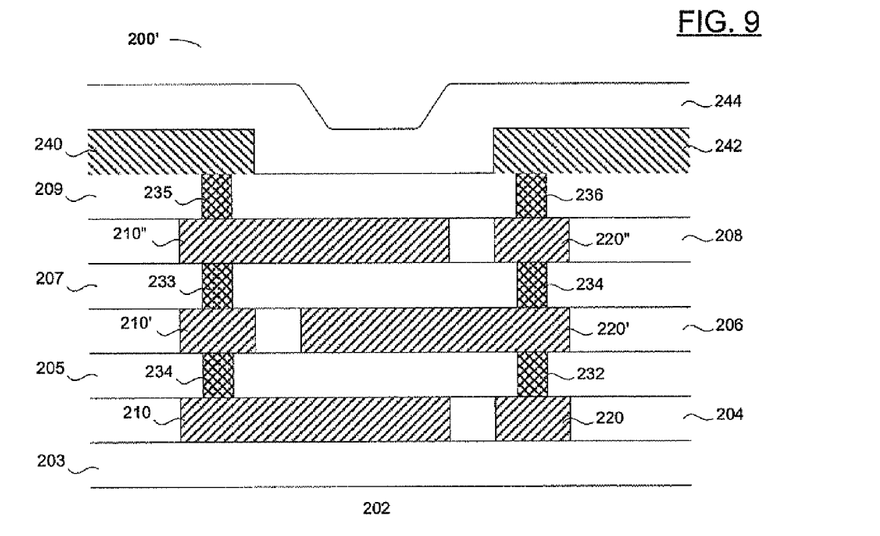
FIG. 9 shows a side view of the exemplary capacitor layout of FIG. 7.

FIG. 9 shows a side view of a multi-metal layer capacitor 200', generally comprising a plurality of the first and second capacitor structures shown in FIG. 8. Multi-metal layer capacitor 200' includes first and second interleaved capacitor structures 210 and 220 in first metal layer 204 (which overlies a dielectric layer 203 on IC substrate 202), third and fourth interleaved capacitor structures 210' and 220' in second metal layer 206, fifth and sixth interleaved capacitor structures 210" and 220" in third metal layer 208, and first and second conductors 240 and 242. A conventional passivation layer 244 overlies first and second conductors 240 and 242. Vias 235 and 236 electrically connect first and second conductors 240 and 242 to fifth and sixth interleaved capacitor structures 210" and 220", respectively; vias 233 and 234 electrically connect fifth and sixth interleaved capacitor structures 210" and 220" to third and fourth interleaved capacitor structures 210' and 220', respectively; and vias 231 and 232 electrically connect third and fourth interleaved capacitor structures 210' and 220' to first and second interleaved capacitor structures 210 and 220, respectively. First and second conductors 240 and 242 respectively connect capacitor 200' to adjacent or neighboring bond pads (e.g., 142 and 144 in FIG. 5). Referring back to FIG. 9, each of vias 231-236 may comprise a plurality of vias, the number of which may depend on the length of the corresponding capacitor structure backbone (see, e.g., backbones 218 and 228 in FIG. 8) and/or the number of fingers in the corresponding capacitor structure.

Unshaded regions in metal layers 204, 206 and 208 generally comprise one or more layers of dielectric material (such as silicon dioxide, which may be undoped or doped with fluorine or boron and/or phosphorous, as is known in the art), as do unshaded regions 205, 207 and 209 between the metal layers. As shown in FIG. 9, the fourth metal layer (comprising conductors 240 and 242) may comprise a photolithographically produced metal (such as aluminum), and the vias and first through third metal layers comprise damascene metal (such as tungsten and copper, respectively, although when copper is used, the via and overlying metal layer are generally formed at the same time, as is known in the art, and the interface between metal and via dielectric layers may comprise a thin "etch stop" dielectric, such as silicon nitride). As is known in the art, the first through third metal layers of damascene metal may be replaced with photolithographically produced metal, and a combination of a damascene metal layer and an underlying via may be replaced with "dual damascene" metal. Although four layers of metal are shown, the capacitor may comprise up to one less than the total number of metal layers in a given manufacturing technology.

Capacitor structures 210, 210' and 210" (and/or structures 220, 220' and 220") are shown offset from each other in adjacent metal layers, to increase or maximize capacitive overlap of the fingers of a first capacitor structure in one metal layer with the fingers of one or more second capacitor structures in adjacent metal layers (and/or of the fingers of a second capacitor structure in one metal layer with the fingers of one or more first capacitor structures in adjacent metal layers). However, this arrangement is not required, and each of the first capacitor structures 210, 210' and 210" (and, independently, each of second structures 220, 220' and 220") may capacitively overlap each other, depending on design choices and/or other considerations.

Figure 10:
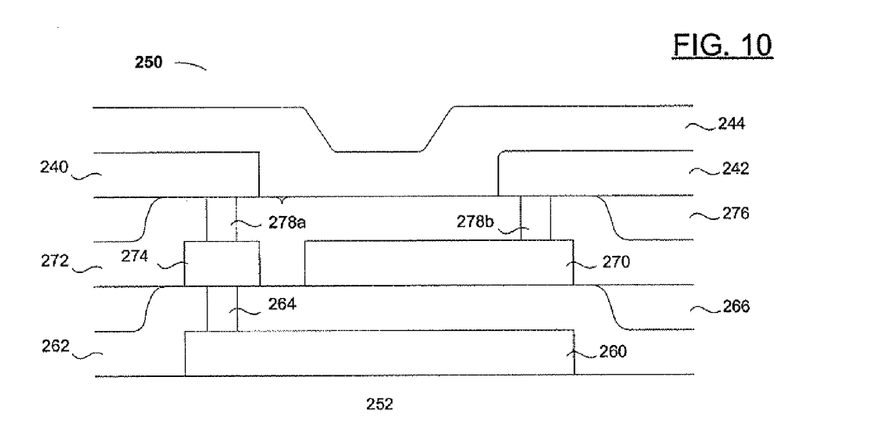
FIG. 10 is a diagram showing an alternative capacitor layout suitable for use in the present invention.

Alternatively, the first capacitor may comprise first and second metal plates in adjacent layers of metal. For example, FIG. 10 shows an alternative capacitor structure 250, generally comprising lower capacitor plate 260 (overlying a dielectric coating 252 on a substrate), upper capacitor plate 270, and first and second conductors 240 and 242 (similar to FIG. 9). Referring back to FIG. 10, first conductor 240 is in electrical communication with lower capacitor plate 260 through via 278a, second level metal structure 274, and via 264. Second conductor 242 is in electrical communication with upper capacitor plate 270 through via 278b. First intermetal dielectric layer 262 serves as the capacitor dielectric. As shown in FIG. 10, first and second conductors 240 and 242, second level metal structure 274, and upper and lower capacitor plates 270 and 260 all comprise photolithographic metal, although other types of metal (as described herein) are also suitable. Various implementations and examples of this type of capacitor can be found in U.S. Pat. Nos. 6,559,493, 6,410, 381, and 6,387,775. Although silicon substrate-based and polysilicon-based capacitors are contemplated for use in the present invention, metal-based capacitors are preferred for manufacturing simplicity (e.g., avoiding any extra mask[s] and/or chip real estate for implant and/or substrate isolation) and/or performance (e.g., signal matching).

Figure 11:
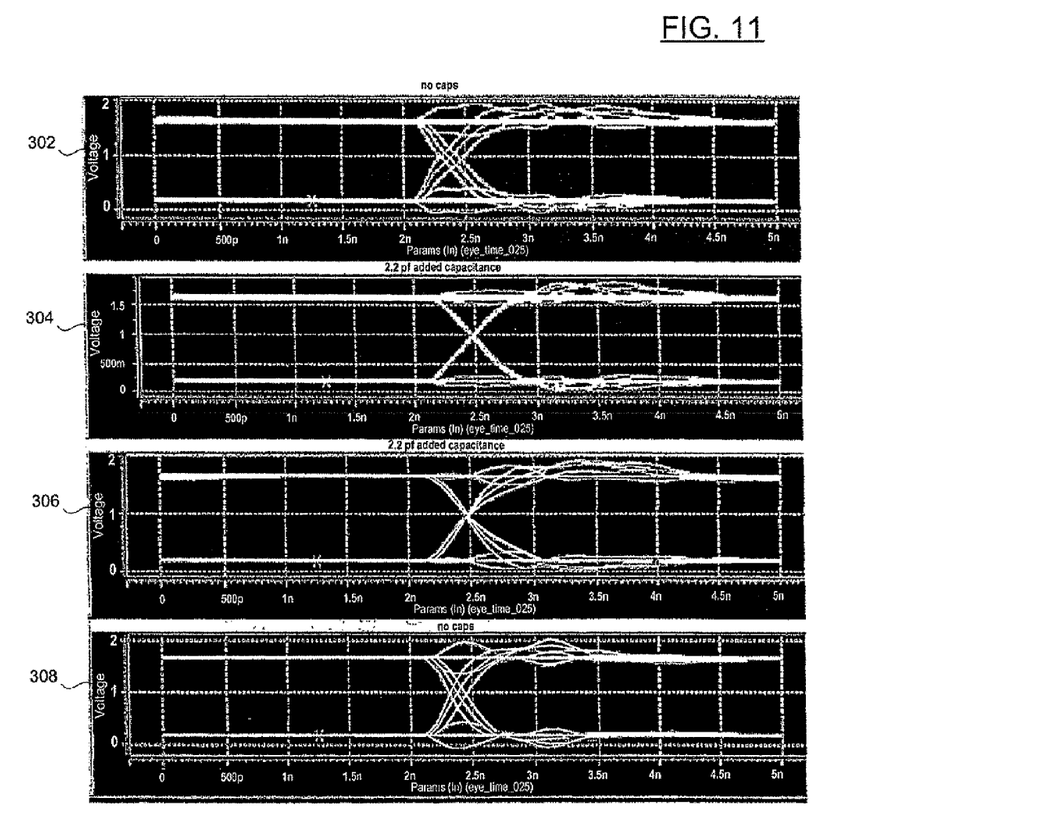
FIG. 11 is a series of simulated waveforms showing the effect of cross talk reduced or substantially eliminated by the present invention.

FIG. 11 shows simulated results provided by an exemplary embodiment of the present invention having a 2.2 pF capacitor coupled to adjacent bond pads for adjacent data I/O pins on an IC, for both read (e.g., data input) and write (e.g., data output) operations and both rising and falling transitions, compared to an otherwise identical IC without a capacitor coupled to the adjacent bond pads.

Plot 302 shows waveforms for a simulated write transaction as sampled on a "far end" load. The chip (before adding the capacitors) is driving the output signal onto an ideal single-ended transmission line. The sampled signal is an eye diagram sampled on an ideal load connected to the ideal transmission line. One can see the jitter simulated here, which is a result of the only part of the connection which is not simulated to be ideal, the package wire bonds. The simulated write transaction involves a PRBS pattern on both sampled (single-ended) signal and aggressor lines (not shown here). The waveforms in plot 302 generally show that jitter in the amount of ~300 psec was induced in the victim line. Furthermore, a noise of about 0.3V peak voltage was induced on the victim line and was present for ~0.7 nsec. (In this example, the noise was during the transition and was thus less important than the jitter.)

Plot 304 shows waveforms on adjacent I/O pins for the same simulation as for plot 302, for an IC with a 2.2 pF capacitor between adjacent bond pads. The waveforms in plot 304 generally show that the eye pattern jitter was reduced to ~50 psec, and all three phases of the rising edges and falling edges that can be seen on plot 302 were merged into one main rising edge waveform and one main falling edge waveform. Furthermore, the noise induced on the victim pin decreased to about 0.10-0.15 V, a reduction in induced noise of about 65-75% relative to the IC without the capacitor, and the induced noise fell to an undetectable level in less than 1 ns.

Plot 308 shows simulated waveforms on adjacent I/O pins for a simulated read transaction involving PRBS transitions on both aggressor and victim lines for an IC without the capacitor between adjacent bond pads. The waveform in plot 308 generally shows an eye pattern jitter of ~300 psec, caused by the package wire bonds on the receiving chip.

Plot 306 shows waveforms on adjacent I/O pins for the same simulation as for plot 308, for an IC with a 2.2 pF capacitor between adjacent bond pads. The waveforms in plot 306 generally show that the eye pattern jitter was reduced to ~50 psec at half the voltage (around Vref), and all three phases of the rising edges and falling edges that can be seen on plot 308 were merged into one main rising edge waveform and one main falling edge waveform. In the read transaction, the three different phases can still be seen, although they are all merged at the voltage midpoint.

A Second Exemplary Integrated Circuit and/or Architecture

A further aspect of the invention relates to the present integrated circuitry, but further comprising: (1) a third input/output (I/O) pad having a third I/O signal line coupled thereto; and (2) a second capacitor having (i) a first terminal coupled to the second I/O pad and/or the second I/O signal line, (ii) a second terminal coupled to the third I/O pad and/or the third I/O signal line, and (iii) a capacitance sufficient to reduce effects of cross talk between the second and third I/O signal line. As for the integrated circuit described above, the third I/O signal line may comprise a third wire bond to the integrated circuit package substrate, and the first signal on the first I/O signal line also induces cross talk in the third I/O signal line. However, in the latter case, the integrated circuit may further comprise a third capacitor having first and second terminals respectively coupled to the first I/O pad and/or signal line and the third I/O pad and/or signal line, configured to reduce, minimize or substantially cancel the effect(s) of cross talk from the first signal in the third I/O signal line.

As shown to some extent in the plots of FIG. 11, the present capacitor arrangement can significantly reduce the effects of cross talk in adjacent I/O signal lines. However, signal toggling in an I/O line can induce cross talk in neighboring I/O signal lines that are further away from the toggling line than the nearest neighbor (i.e., the adjacent line). Thus, the invention also concerns a means for reducing the effect(s) of cross talk in neighboring (but not necessarily adjacent) I/O signal lines. While this additional capacitor will in most cases further decrease the amount of cross talk noise, it may also complicate the implementation of the circuit, and thus, it is not mandatory.

Figure 12:
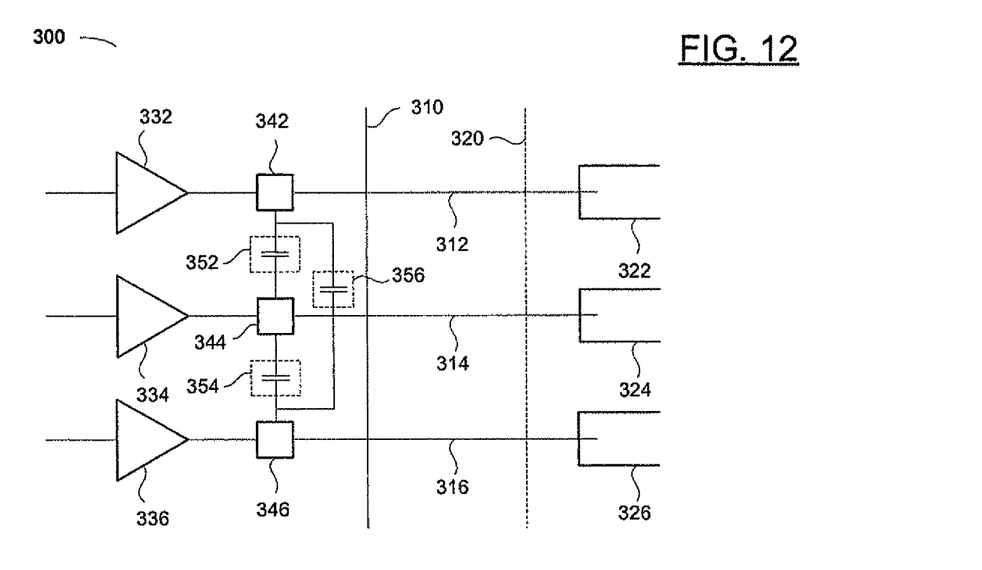
FIG. 12 is a diagram showing a further embodiment of the present invention.

FIG. 12 shows an exemplary integrated circuit 300, including first, second and third wire bonds 312, 314 and 316, respectively; first, second and third leads (or traces) 322, 324 and 326, respectively, on packaging substrate 320; first, second and third output buffers 332, 334 and 336, respectively; first, second and third bond pads 342, 344 and 346, respectively; and first, second and third capacitors 352, 354 and 356, respectively. Wire bonds 312, 314 and 316 electrically connect bond pads 342, 344 and 346 on IC die 310 to substrate leads 322, 324 and 326, respectively. First capacitor 352 is coupled between first I/O signal path (comprising wire bond 312 and bond pad 342) and second I/O signal path (comprising wire bond 314 and bond pad 344), second capacitor 354 is coupled between second I/O signal path and third I/O signal path (comprising wire bond 316 and bond pad 346), and third capacitor 356 is coupled between the first and third I/O signal paths. First and second capacitors 352 and 354 generally operate as described above to reduce or minimize the effect(s) of cross talk between the first and second I/O signal paths and the second and third I/O signal paths, respectively. However, third capacitor 356 is configured to further reduce or minimize the effect(s) of cross talk between the first I/O signal path and the third I/O signal path that capacitors 354 and 352 were not sufficiently configured to reduce or eliminate. Capacitors 352 and 354 do, in fact, comprise a capacitance between pads 342 and 346. However, capacitor 356 is generally configured to offset a difference between (a) the capacitance configured to reduce, minimize or cancel cross inductance between wire bonds 312 and 316 and (b) the combined capacitance of capacitor 352 parallel to and/or in series with capacitor 354. Capacitor 356 may thus be intended to make up for the "delta" in the cross inductance.

Operationally, third capacitor 356 reduce the effect(s) of cross talk between the first and third I/O signal paths in the same way that the capacitor 352 reduces the effect(s) of cross talk between the first and second I/O signal paths. The capacitance of third capacitor 356 may be selected in accordance with the package cross-inductance values between similarly arranged I/O paths. However, it is expected that the magnitude of the cross talk induced in the third I/O signal path by a transition in the first I/O signal path will be smaller than that in an adjacent I/O signal path. To some extent, the phase difference of the cross talk induced in the third I/O signal path by a transition in the first I/O signal path may be greater than that in an adjacent I/O signal path. Thus, third capacitor 356 may be configured to have a smaller capacitance than either of first and second capacitors 352 and 354. Furthermore, the metal lines coupling bond pads 342 and 346 to third capacitor 356 may have a length configured to offset the phase difference between the cross talk induced in an adjacent I/O signal line and a neighboring (but not adjacent) I/O signal line.

Naturally, the present IC may have up to all of its I/O signal paths capacitively coupled to any adjacent (nearest neighbor) I/O signal paths, next nearest neighbor I/O signal paths, third nearest neighbor I/O signal paths, and so on until a desired or predetermined level of cross talk influence reduction or minimization is achieved. Determining the number of neighboring I/O signal paths whose cross talk influence is to be reduced or minimized will determine the implementation simplicity or complexity and the amount of physical space that the implementation will consume.

Exemplary Methods

The present invention further relates to a method of reducing the effect(s) of cross talk in an input/output (I/O) signal line, comprising the steps of: (1) transmitting or receiving a signal along a first I/O signal line in an integrated circuit, the first I/O signal line communicating with a first I/O pad on the integrated circuit, and the integrated circuit having a second I/O signal line communicating with a second I/O pad; and (2) capacitively coupling the signal to the second I/O pad and/or the second I/O signal line, sufficiently to reduce effect(s) of cross talk in the second I/O signal line. The method generally enables a reduction or minimization of noise and/or jitter in adjacent or neighboring I/O signal paths induced by such cross talk.

As for the present circuitry, the first and second I/O signal lines may respectively comprise first and second wire bonds to an integrated circuit package substrate; the integrated circuit may further comprise a first capacitor having (i) a first terminal coupled to the first I/O pad and/or the first I/O signal line, (ii) a second terminal coupled to the second I/O pad and/or the second I/O signal line, and (iii) a capacitance sufficient to reduce, minimize or substantially cancel effects of cross talk between the first and second I/O signal lines. In various embodiments, the capacitor has a capacitance of from about 1 pF to about 3 pF, and/or the capacitor comprises first and second metal structures in a single layer of metal, in which case each of the first and second metal structures may comprise a plurality of interleaved fingers, each connected at one end to a perpendicular backbone. Alternatively, the first capacitor may comprise first and second metal plates in adjacent layers of metal.

In a further embodiment, similar to the second exemplary integrated circuit described above, the integrated circuit may further comprise (1) a third input/output (I/O) pad having a third I/O signal line coupled thereto, and (2) a second capacitor having (i) a first terminal coupled to the first I/O pad and/or the first I/O signal line, and (ii) a second terminal coupled to the third I/O pad and/or the third I/O signal line. In such a case, the method may further comprise (1) capacitively coupling the signal to the third I/O pad and/or the third I/O signal line, sufficiently to reduce the effect(s) of cross talk in the third I/O signal line. Naturally, the third I/O signal line may comprise a third wire bond to the integrated circuit package substrate.

Also similar to the second exemplary integrated circuit described above, a second signal on the second or third I/O signal line may also induce cross talk in the other I/O signal line. Thus, the integrated circuit may further comprise a third capacitor that capacitively couples signals on the second and third I/O lines to each other, and the method may further comprise transmitting or receiving a second signal along the second or third I/O signal line, and capacitively coupling the second signal to the other of the second or third I/O pad and/or I/O signal line, sufficiently to reduce or minimize the effect(s) of cross talk in the other I/O signal line. The capacitors, I/O signal lines and packaging substrate in the present method may take any of the forms described above with regard to the exemplary circuitry, and the method may be applied to an integrated circuit having any number of I/O signal paths configured as described above with regard to the exemplary circuitry.

CONCLUSION/SUMMARY

Thus, the present invention provides circuitry, architectures, systems and methods for reducing, minimizing or substantially eliminating the effect(s) of cross talk in adjacent or neighboring I/O signal paths. The circuitry generally comprises (a) a first input/output (I/O) pad having a first I/O signal line coupled thereto; (b) a second I/O pad having a second I/O signal line coupled thereto; and (c) a first capacitor having (i) a first terminal coupled to the first I/O pad and/or the first I/O signal line, (ii) a second terminal coupled to the second I/O pad and/or the second I/O signal line, and (iii) a capacitance sufficient to reduce effects of cross talk between the first and second I/O signal lines. The method generally comprises the steps of (1) transmitting or receiving a signal along a first I/O signal line in an integrated circuit, the first I/O signal line communicating with a first I/O pad on the integrated circuit, and the integrated circuit having a second I/O signal line communicating with a second I/O pad; and (2) capacitively coupling the signal to the second I/O pad and/or the second I/O signal line, sufficiently to reduce the effect(s) of the cross talk in the second I/O signal line. As demonstrated by the simulations shown in FIG. 11, the present invention can be effective for significantly reducing the effects of cross talk in neighboring I/O signal paths, for both input and output signals.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An electrical circuit, comprising:
   a plurality of traces that are single ended, each trace coupled to an input/output (I/O) pad, at least two of the traces having a cross inductance;
   a capacitor configured to generate a cross capacitance between the at least two of the traces, the cross capacitance having a sufficient magnitude to reduce effects of cross talk resulting from the cross inductance between the at least two of the traces;
   an I/O block including the I/O pad, an input buffer configured to receive input signals transmitted to the I/O pad, and an output buffer configured to receive a signal that places the output buffer in a high-impedance state when the I/O block receives one of the input signals.

2. The electrical circuit of claim 1, wherein the capacitor has a first terminal coupled to a first trace of the at least two of the traces, and a second terminal coupled to a second trace of the at least two of the traces.

3. The electrical circuit of claim 2, wherein the first and second traces respectively comprise first and second wire bonds to an electrical circuit package substrate.

4. The electrical circuit of claim 2, wherein the capacitor has a capacitance sufficient to minimize or substantially cancel the cross talk in the second trace.

5. The electrical circuit of claim 1, wherein the cross talk manifests itself as voltage noise or timing jitter.

6. The electrical circuit of claim 1, wherein the capacitor has a capacitance of from about 1 pF to about 3 pF.

7. The electrical circuit of claim 1, wherein the capacitor comprises first and second metal structures in a single layer of metal.

8. The electrical circuit of claim 7, wherein each of the first and second metal structures comprises a plurality of interleaved fingers, each connected at one end to a perpendicular backbone.

9. The electrical circuit of claim 1, wherein the capacitor comprises first and second metal plates in adjacent layers of metal.

10. The electrical circuit of claim 1, wherein the at least two of the traces are first and second traces, and the capacitor is a first capacitor, further comprising:
   a second capacitor configured to generate a cross capacitance between the second trace and a third trace of the traces, the cross capacitance having a sufficient magnitude to reduce effects of cross talk resulting from a cross inductance of the second and third traces.

11. A method of reducing cross talk in a trace, comprising:

transmitting or receiving a signal along one of at least two of a plurality of traces that are single ended, each trace coupled to an input/output (I/O) pad, the at least two of the traces having a cross inductance;

generating, by a capacitor, a cross capacitance between the at least two of the traces, the cross capacitance having a sufficient magnitude to reduce effects of cross talk resulting from the cross inductance between the at least two of the traces;

receiving input signals transmitted to the I/O pad by an input buffer included in an I/O block having an output buffer; and placing the output buffer in a high-impedance state when the I/O block receives one of the input signals.

12. The method of claim 11, further comprising:

coupling a first terminal of the capacitor to a first trace of the at least two of the traces; and coupling a second terminal of the capacitor to a second trace of the at least two of the traces.

13. The method of claim 12, further comprising:

bonding the first and second traces by wires to an electrical circuit package substrate.

14. The method of claim 12, further comprising:

minimizing or substantially cancelling the cross talk in the second trace.

15. The method of claim 11, wherein the cross talk manifests itself as voltage noise or timing jitter.

16. The method of claim 11, wherein the capacitor has a capacitance of from about 1 pF to about 3 pF.

17. The method of claim 11, wherein the capacitor comprises first and second metal structures in a single layer of metal.

18. The method of claim 17, wherein each of the first and second metal structures comprises a plurality of interleaved fingers, each connected at one end to a perpendicular backbone.

19. The method of claim 11, wherein the capacitor comprises first and second metal plates in adjacent layers of metal.

20. The method of claim 11, wherein the at least two of the traces are first and second traces, and the capacitor is a first capacitor, further comprising:

generating, by a second capacitor, a cross capacitance between the second trace and a third trace of the traces, the cross capacitance having a sufficient magnitude to reduce effects of cross talk resulting from a cross inductance of the second and third traces.

* * * * *